(12) United States Patent
Li et al.

(10) Patent No.: US 8,140,949 B2
(45) Date of Patent: Mar. 20, 2012

(54) ACS UNIT OF A VITERBI DECODER AND METHOD FOR CALCULATING A BIT ERROR RATE BEFORE A VITERBI DECODER

(75) Inventors: Shu-Mei Li, Taipei (TW); Szu-Chung Chang, Taipei (TW)

(73) Assignee: Alpha Imaging Technology Corp., Hsinchu (TW)

( * ) Notice: Subject to any disclaimer, the term of this patent is extended or adjusted under 35 U.S.C. 154(b) by 1162 days.

(21) Appl. No.: 11/938,788

(22) Filed: Nov. 13, 2007

(65) Prior Publication Data

US 2009/0125794 A1    May 14, 2009

(51) Int. Cl.
*H03M 13/03*    (2006.01)
*G06F 11/00*    (2006.01)
*H04L 27/06*    (2006.01)

(52) U.S. Cl. .................. 714/795; 714/704; 375/341

(58) Field of Classification Search .............. 714/704, 714/795, 796; 375/341
See application file for complete search history.

(56) References Cited

U.S. PATENT DOCUMENTS

| | | | |
|---|---|---|---|
| 5,331,665 A * | 7/1994 | Busschaert et al. | 375/341 |
| 6,477,661 B2 * | 11/2002 | Yamanaka et al. | 714/1 |
| 2006/0115023 A1 * | 6/2006 | Ovadia et al. | 375/341 |

OTHER PUBLICATIONS

Riani, J.; van Beneden, S.; Bergmans, J.W.M.; Immink, A.H.J.; , "Near-Minimum Bit-Error Rate Equalizer Adaptation for PRML Systems," Communications, IEEE Transactions on , vol. 55, No. 12, pp. 2316-2327, Dec. 2007.*
Parhi, K.K.; , "An improved pipelined MSB-first add-compare select unit structure for Viterbi decoders," Circuits and Systems I: Regular Papers, IEEE Transactions on , vol. 51, No. 3, pp. 504-511, Mar. 2004.*

* cited by examiner

*Primary Examiner* — Cynthia Britt
(74) *Attorney, Agent, or Firm* — Jianq Chyun IP Office

(57) ABSTRACT

An ACS unit of a Viterbi decoder and a method for calculating the bit error rate (BER) before Viterbi decoder are provided. The ACS unit includes a state calculator and a BER calculator. The state calculator calculates the state metric of a corresponding target state in the trellis diagram and selects one of two candidate source states as the selected source state of the target state. The state calculator also provides a selection signal indicating the selected source state. The BER calculator is coupled to the state calculator for providing the sum of the BER of the selected source state and the bit error count (BEC) of the transition from the selected source state to the target state as the BER of the target state.

15 Claims, 3 Drawing Sheets

ACS UNIT OF A VITERBI DECODER AND METHOD FOR CALCULATING A BIT ERROR RATE BEFORE A VITERBI DECODER

BACKGROUND OF THE INVENTION

1. Field of the Invention

The present invention relates to a Viterbi decoder. More particularly, the present invention relates to calculating a bit error rate (BER) before a Viterbi decoder.

2. Description of the Related Art

Viterbi algorithm is popular for decoding convolution codes in communication systems. For a constraint length of N, there are $2^N$ states in the trellis diagram. A Viterbi decoder has to calculate state metrics for each of the $2^N$ states in order to find out the shortest trellis path. In a conventional Viterbi decoder, an add-compare-select (ACS) unit is used for each state for state metric calculation and trellis path selection.

FIG. 1 is a schematic diagram showing the structure of a conventional ACS unit of a Viterbi decoder. This ACS unit includes two adders 101 and 102, a comparator 103, and a multiplexer (MUX) 104. For example, assume the ACS unit is allocated to state C and there are two candidate source states A and B for the target state C. The adder 101 adds the state metric of state A and the branch metric of the transition from state A to state C, and then provides the result as the first sum. Likewise, the adder 102 adds the state metric of state B and the branch metric of the transition from state B to state C, and then provides the result as the second sum. Here a state metric is an accumulation of a predetermined initial value and the branch metrics of successive state transitions leading to a state. A branch metric is calculated by comparing the target code with the input data received by the Viterbi decoder. The target code is generated from the state transition diagram of the convolution encoder. Each state transition gives a unique output code (Viterbi target code) and implies a unique input data (Viterbi input data).

The comparator 103 compares the first sum and the second sum, and then selects the candidate source state corresponding to the lesser sum as the selected source state of the target state C. One bit of the original data is decoded by this selection of source state out of two candidates. Next, the comparator 103 provides a selection signal SS indicating the selected source state. The metric multiplexer 104 outputs the lesser one of the first sum and the second sum as the state metric of state C according to the selection signal SS.

A Viterbi decoder keeps receiving input data and updating the state metrics of all the states at each reception of an input data symbol until the traceback length is satisfied, and then the Viterbi decoder starts decoding the convolution code by tracing the shortest trellis path. The shortest trellis path begins at the state with the smallest state metric and passes through the chain of sources states of the state with the smallest state metric.

The bit error rate (BER) before Viterbi decoder is a performance criterion for a communication system. FIG. 2 is a schematic diagram showing a conventional circuit for calculating BER before Viterbi decoder. The circuit includes a Viterbi decoder 201, a convolution encoder 202, a storage element 203, and a comparator 204. The Viterbi decoder 201 decodes the Viterbi input data 221. The convolution encoder 202 performs the same convolution encoding as its counterpart in the transmitter of the communication system does on the output of the Viterbi decoder 201. The storage element 203 stores the Viterbi input data 221 and outputs them after some delay so that the output of the convolution encoder 202 can be synchronous with the corresponding Viterbi input data 221. The comparator 204 compares the output of the convolution encoder 202 with the corresponding Viterbi input data 221 provided by the storage element 203 and then outputs the comparison result 222. Each time the comparison result 222 indicates a difference between the output of the convolution encoder 202 and the Viterbi input data 221, the BER is increased by one.

Using this methodology, the Viterbi input data 221 must be saved for a period equal to the traceback length of the Viterbi decoder 201. For example, assume a rate ¼ convolution encoder and a 4-bit soft decision Viterbi decoder are used and the traceback length of the Viterbi decoder is 80, the size of the storage element must be no less than 4*4*80=1280 bits.

SUMMARY OF THE INVENTION

Accordingly, the present invention is directed to an ACS unit of a Viterbi decoder and a corresponding method for calculating the BER before Viterbi decoder. The proposed ACS unit and method can calculate the BER simultaneously with state metric calculation without temporary storage of Viterbi input data and extra convolution encoding used in conventional calculation circuits. As a result, the present invention can reduce the cost and complexity of a receiver system including a Viterbi decoder by dispensing with the convolution encoder and the storage element.

According to an embodiment of the present invention, an ACS unit of a Viterbi decoder is provided. The ACS unit includes a state calculator and a BER calculator. The state calculator calculates a first sum and a second sum. The first sum is the sum of the state metric of a first candidate source state and the branch metric of the transition from the first candidate source state to a target state. The second sum is the sum of the state metric of a second candidate source state and the branch metric of the transition from the second candidate source state to the target state. The state calculator provides a selection signal indicating a selected source state which is the first candidate source state or the second candidate source state corresponding to the lesser one of the first sum and the second sum. The state calculator also provides the lesser sum as the state metric of the target state. The BER calculator is coupled to the state calculator for providing a third sum of the BER of the selected source state and the bit error count (BEC) of the transition from the selected source state to the target state as the BER of the target state.

In an embodiment of the present invention, the Viterbi decoder includes a plurality of ACS units and each of the ACS units calculates a BER for its corresponding target state. The BERs of all the target states are stored in a storage element. In addition, the Viterbi decoder periodically outputs the smallest BER among all the target states as the BER before Viterbi decoder and then resets all the BERs to zero according to a predetermined period.

According to another embodiment of the present invention, a method for calculating a BER before a Viterbi decoder is provided. The method includes the following steps. First, calculate a first sum of the state metric of a first candidate source state and the branch metric of the transition from the first candidate source state to a target state. Next, calculate a second sum of the state metric of a second candidate source state and the branch metric of the transition from the second candidate source state to the target state. Provide a selection signal indicating a selected source state which is the first candidate source state or the second candidate source state corresponding to the lesser one of the first sum and the second sum. Provide the lesser sum as the state metric of the target state. Next, provide the sum of the BER of the selected source state and the BEC of the transition from the selected source state to the target state as the BER of the target state. In this way, a BER is calculated for each target state in the trellis diagram and the smallest BER among all the target states is provided as the BER before Viterbi decoder.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
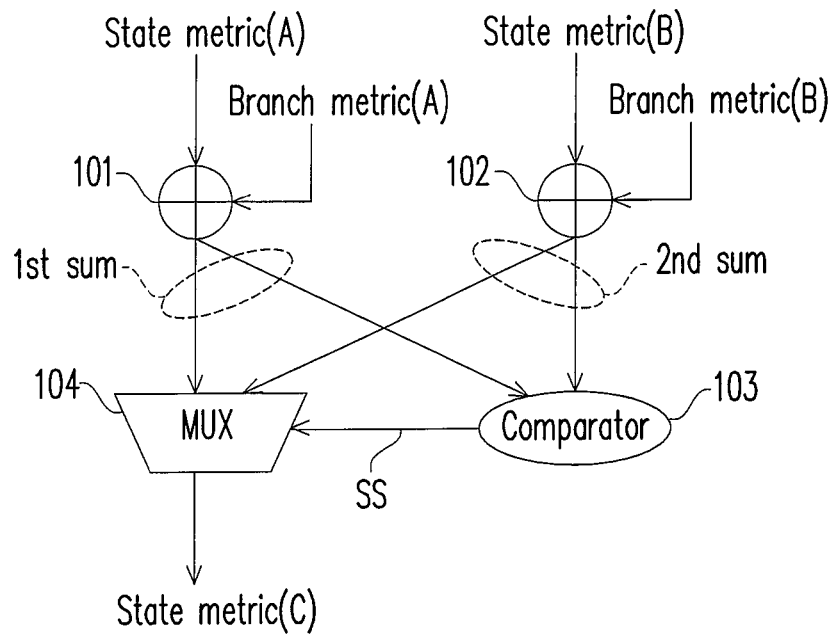
FIG. 1 is a schematic diagram showing the structure of a conventional ACS unit of a Viterbi decoder.
Figure 2:
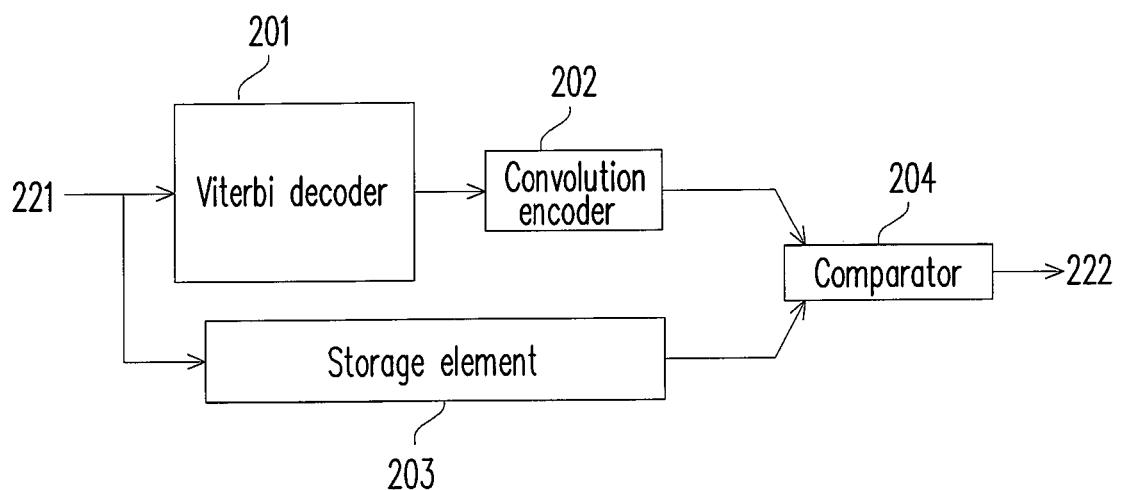
FIG. 2 is a schematic diagram showing a conventional circuit for calculating BER before a Viterbi decoder.

Reference will now be made in detail to the present embodiments of the invention, examples of which are illustrated in the accompanying drawings. Wherever possible, the same reference numbers are used in the drawings and the description to refer to the same or like parts.

Figure 3:
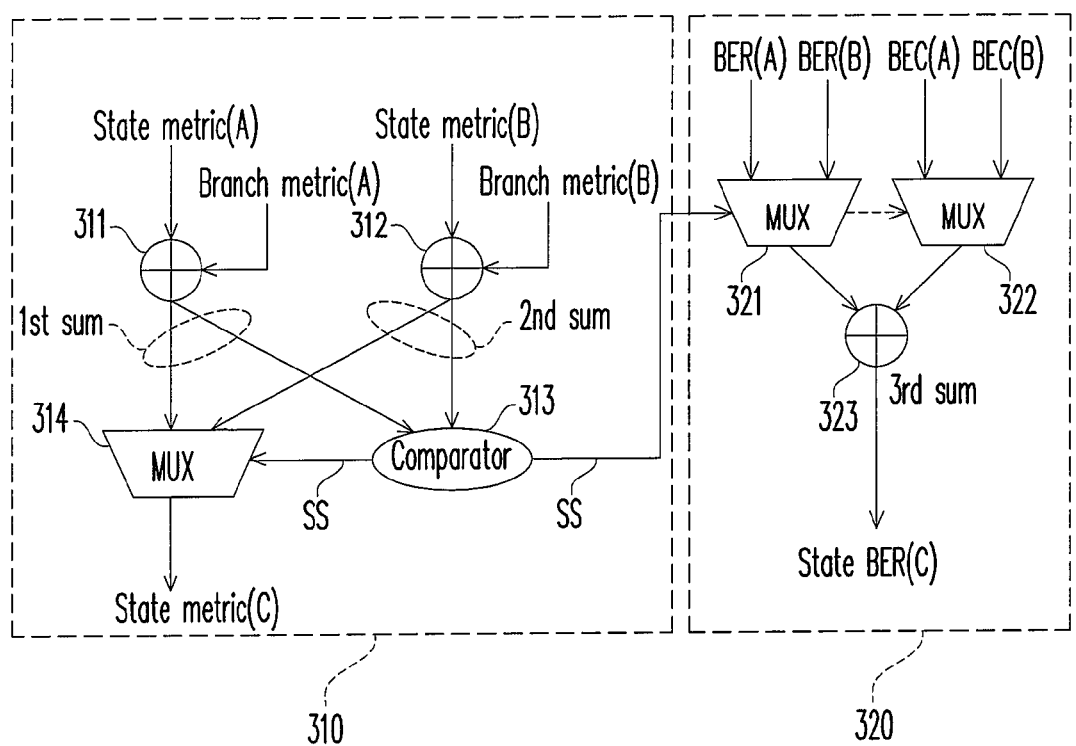
FIG. 3 is a schematic diagram showing the structure of an ACS unit according to an embodiment of the present invention.
Figure 4:
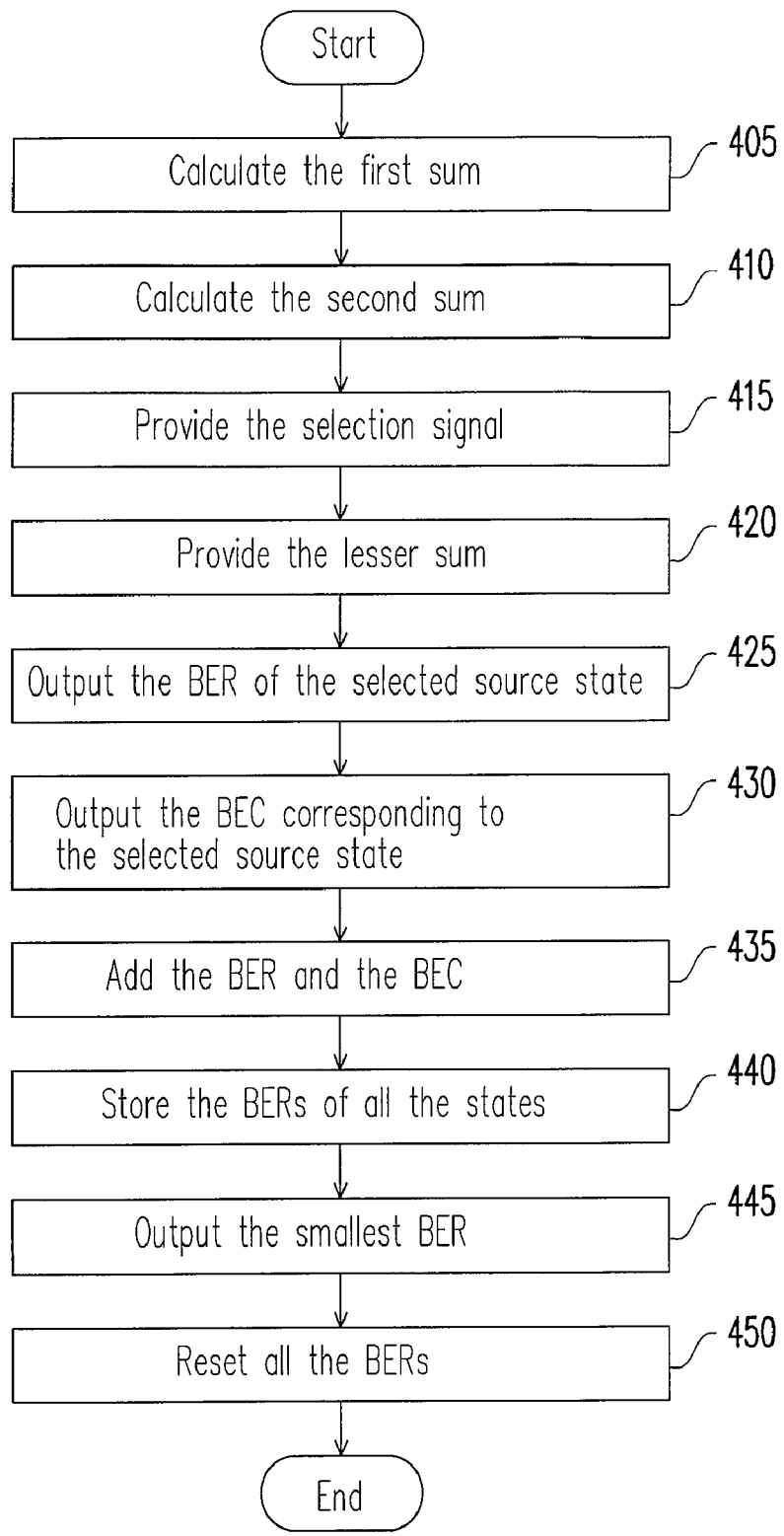
FIG. 4 is a flow chart of a method for BER calculation executed by a Viterbi decoder including the ACS unit in FIG. 3.

For the discussions below please refer to FIG. 3 and FIG. 4. FIG. 3 is a schematic diagram showing the structure of an ACS unit according to an embodiment of the present invention. FIG. 4 is a flow chart of a method for calculating BER before Viterbi decoder executed by a Viterbi decoder including the ACS unit in FIG. 3.

The ACS unit in FIG. 3 includes a state calculator 310 and a BER calculator 320. The state calculator 310 includes two adders 311 and 312, a comparator 313, and a metric multiplexer 314. The BER calculator 320 includes a BER multiplexer 321, a BEC multiplexer 322, and an adder 323. The comparator 313 is coupled to the adders 311 and 312. The metric multiplexer is coupled to the adders 311 and 312 and the comparator 313. The BER multiplexer 321 is coupled to the comparator 313. The BEC multiplexer 322 is also coupled to the comparator 313. The adder 323 is coupled to the BER multiplexer 321 and the BEC multiplexer 322.

By executing the flow in FIG. 4, the ACS unit in FIG. 3 can calculate the BER before Viterbi decoder of a corresponding target state without the need for temporary input storage or convolution encoding. The flow in FIG. 4 begins at step 405. For example, assume the ACS unit is corresponding to the target state C and the two candidate source states of state C are state A and state B.

First, in step 405, the adder 311 calculates the sum of the state metric of state A and the branch metric of the transition from state A to state C, and then outputs the result (the first sum). Simultaneously in step 410 the adder 312 calculates the sum of the state metric of state B and the branch metric of the transition from state B to state C, and then outputs the result (the second sum). Next, in step 415 the comparator 313 compares the first sum with the second sum, selects the candidate source state corresponding to the lesser sum as the selected source state of the target state C, and then provides a selection signal SS indicating the selected source state. In step 420, the metric multiplexer 314 receives the first sum and the second sum and then outputs the lesser sum as the state metric of state C according to the selection signal SS.

The selection signal SS is also provided to the BER multiplexer 321 and the BEC multiplexer 322. In step 425, the BER multiplexer 321 receives the BER of state A and the BER of state B and outputs the BER of the selected source state according to the selection signal SS. Next, in step 430, the BEC multiplexer 322 receives the BEC (explained later) of the transition from state A to state C and the BEC of the transition from state B to state C and then outputs the BEC corresponding to the selected source state according to the selection signal SS. Next, in step 435, the adder 323 calculates the sum of the BER of the selected source state and the BEC of the transition from the selected source state to state C and then provides the result (the third sum) as the BER of state C.

The BEC is the number of differences between a Viterbi target code and the corresponding Viterbi input data. For example, if there are two differences between a Viterbi target code and the corresponding Viterbi input data, the BEC is two. The following Table 1 is a more detailed example for a ¼ convolution encoder. The Viterbi decoder including the ACS unit in FIG. 3 may be a hard decision Viterbi decoder or a soft decision Viterbi decoder.

TABLE 1

| | a BEC example | | | |
|---|---|---|---|---|
| | Target code | Input data | Branch metric | BEC |
| Hard decision | (1, 1, 0, 0) | (0, 1, 0, 0) | 1 + 0 + 0 + 0 = 1 | 1 + 0 + 0 + 0 = 1 |
| Soft decision | (7, 7, −8, −8) | (−8, 0, −4, −8) | 15 + 7 + 4 + 0 = 26 | 1 + 0 + 0 + 0 = 1 |

As the state calculator 310 calculates state metrics, each state transition generates a target code. Each target code is an expected input data. Since BEC is generated from the difference between target code and real input data, the accumulation of BECs of successive state transitions leading to a state is the BER of this destination state. The state metric and the BER of each state may be stored in the same storage element, such as a memory. The management of the BER of each state is similar to the management of the state metric of each state. The generation of the BEC of each state transition is similar to the generation of the branch metric of each state transition. Both the management of the state metrics and the generation of the branch metrics are conventional and well-known. After reading the above discussions of this embodiment, anyone skilled in the art can implement the management of the BERs in a way similar to the management of the state metrics and implement the generation of the BECs in a way similar to the generation of the branch metrics. Therefore the related details are not discussed here.

The ACS unit in FIG. 3 is one of many ACS units of a Viterbi decoder. The Viterbi decoder calculates the BER of each target state in the trellis diagram using the ACS units. For example, each ACS unit may calculate the BER of a corresponding target state. The ACS units calculate the BERs of the target states in parallel by executing the same flow from step 405 to step 435 in FIG. 4. After step 435 is finished, the BERs of all the target states are available. Next, in step 440, the Viterbi decoder stores the BERs of all the target states in the storage element. Next, the Viterbi decoder outputs the smallest BER among all the target states as the BER before Viterbi decoder in step 445 and then resets all the BERs to zero in step

450. Steps 445 and 450 are executed periodically according to a predetermined period. Choosing a shorter period can reduce the size of BER storage. However, for the accuracy of estimation, it is recommended for the predetermined period to be equal to or longer than the traceback length of the Viterbi decoder.

In summary, the ACS unit and the method proposed by the present invention calculate the BER simultaneously with state metric calculation. The present invention does not need temporary storage of Viterbi input data and extra convolution encoding used in conventional calculation circuits. As a result, the present invention reduces the cost and complexity of a receiver system including a Viterbi decoder by dispensing with the convolution encoder and the storage element.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An ACS unit of a Viterbi decoder, comprising:
    a state calculator for calculating a first sum of a first state metric of a first candidate source state and a first branch metric of a first transition from the first candidate source state to a target state, calculating a second sum of a second state metric of a second candidate source state and a second branch metric of a second transition from the second candidate source state to the target state, providing a selection signal indicating a selected source state which is the first candidate source state or the second candidate source state corresponding to the lesser one of the first sum and the second sum, and then providing the lesser sum as a target state metric of the target state; and
    a BER calculator coupled to the state calculator for providing a third sum of a BER of the selected source state and a BEC of the transition from the selected source state to the target state as a BER of the target state.

2. The ACS unit of claim 1, wherein the state calculator comprises:
    a first adder for adding the first state metric and the first branch metric and providing the first sum;
    a second adder for adding the second state metric and the second branch metric and providing the second sum;
    a comparator coupled to the first adder and the second adder for providing the selection signal according to a comparison of the first sum and the second sum; and
    a metric multiplexer coupled to the first adder, the second adder, and the comparator for outputting the lesser one of the first sum and the second sum as the target state metric according to the selection signal.

3. The ACS unit of claim 1, wherein the BER calculator comprises:
    a BER multiplexer coupled to the state calculator for receiving a BER of the first candidate source state and a BER of the second candidate source state and outputting the BER of the selected source state according to the selection signal;
    a BEC multiplexer coupled to the state calculator for receiving a BEC of the first transition and a BEC of the second transition and outputting the BEC corresponding to the selected source state according to the selection signal; and
    a third adder coupled to the BER multiplexer and the BEC multiplexer for adding the BER of the selected source state and the BEC corresponding to the selected source state and providing the third sum.

4. The ACS unit of claim 1, wherein the Viterbi decoder is a hard decision Viterbi decoder.

5. The ACS unit of claim 1, wherein the Viterbi decoder is a soft decision Viterbi decoder.

6. The ACS unit of claim 1, wherein the Viterbi decoder comprises a plurality of ACS units, each of the ACS units calculates a BER for a corresponding target state; and the BERs of all the target states are stored in a storage element.

7. The ACS unit of claim 6, wherein the Viterbi decoder periodically outputs the smallest BER among all the target states and then resets all the BERs to zero according to a predetermined period.

8. The ACS unit of claim 7, wherein the predetermined period is equal to or longer than the traceback length of the Viterbi decoder.

9. A method for calculating a BER before a Viterbi decoder, comprising:
    calculating a first sum of a first state metric of a first candidate source state and a first branch metric of a first transition from the first candidate source state to a target state;
    calculating a second sum of a second state metric of a second candidate source state and a second branch metric of a second transition from the second candidate source state to the target state;
    providing a selection signal indicating a selected source state which is the first candidate source state or the second candidate source state corresponding to the lesser one of the first sum and the second sum;
    providing the lesser sum as a target state metric of the target state; and
    providing a third sum of a BER of the selected source state and a BEC of the transition from the selected source state to the target state as a BER of the target state.

10. The method of claim 9, wherein the step of providing the third sum comprises:
    receiving a BER of the first candidate source state and a BER of the second candidate source state and outputting the BER of the selected source state according to the selection signal;
    receiving a BEC of the first transition and a BEC of the second transition and outputting the BEC corresponding to the selected source state according to the selection signal; and
    adding the BER of the selected source state and the BEC corresponding to the selected source state and providing the third sum.

11. The method of claim 9, wherein the Viterbi decoder is a hard decision Viterbi decoder.

12. The method of claim 9, wherein the Viterbi decoder is a soft decision Viterbi decoder.

13. The method of claim 9, further comprising:
    calculating a BER for each of a plurality of target states in a trellis diagram; and
    storing the BERs of all the target states in a storage element.

14. The method of claim 13, further comprising:
    periodically outputting the smallest BER among all the target states and then resetting all the BERs to zero according to a predetermined period.

15. The method of claim 14, wherein the predetermined period is equal to or longer than the traceback length of the Viterbi decoder.

* * * * *